(12) United States Patent
Dimke et al.

(10) Patent No.: US 8,822,844 B1
(45) Date of Patent: Sep. 2, 2014

(54) SHIELDING AND POTTING FOR ELECTRICAL CIRCUITS

(75) Inventors: Mark T. Dimke, Cedar Rapids, IA (US); Brandon C. Hamilton, Marion, IA (US); Luke W. Horak, Mount Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 386 days.

(21) Appl. No.: 12/891,050

(22) Filed: Sep. 27, 2010

(51) Int. Cl.
*H05K 9/00* (2006.01)

(52) U.S. Cl.
USPC .......................................... 174/386; 174/521

(58) Field of Classification Search
USPC ................... 174/384, 385, 386, 521; 257/659
See application file for complete search history.

(56) References Cited

U.S. PATENT DOCUMENTS

| | | | | |
|---|---|---|---|---|
| 4,736,069 | A * | 4/1988 | Mullins | 174/385 |
| 7,180,012 | B2 * | 2/2007 | Tsuneoka et al. | 174/521 |
| 7,738,263 | B2 * | 6/2010 | Kitamura et al. | 361/816 |
| 2009/0091907 | A1 * | 4/2009 | Huang et al. | 361/818 |
| 2009/0256244 | A1 * | 10/2009 | Liao et al. | 257/660 |
| 2010/0319981 | A1 * | 12/2010 | Kapusta et al. | 174/350 |

* cited by examiner

*Primary Examiner* — Hung Ngo
(74) *Attorney, Agent, or Firm* — Donna P. Suchy; Daniel M. Barbieri (57) ABSTRACT

A method for shielding an electrical circuit may include depositing a potting material upon the electrical circuit. The method may include providing a path to a ground of the electrical circuit. The method may also include depositing an electrically conductive coating upon the electrical circuit and over the potting material. The method may further include connecting the electrically conductive coating to the ground of the electrical circuit.

8 Claims, 9 Drawing Sheets

SHIELDING AND POTTING FOR ELECTRICAL CIRCUITS

TECHNICAL FIELD

The present disclosure generally relates to the field of electrical circuits, and more particularly to a shielded circuit assembly and a method for shielding and potting electrical circuits.

BACKGROUND

It is often desirable to provide Electromagnetic Interference (EMI) shielding for electronic components included as part of an electrical circuit. For example, electronic components may be isolated from one another and external interference by placing a shield made from a conductive material between the electronic components. One type of EMI shield is constructed by machining a metal cage from a block of metal material and connecting it to an electrical circuit.

SUMMARY

A method for shielding and potting an electrical circuit may include depositing a potting material upon the electrical circuit. The method may include providing a path to a ground of the electrical circuit. The method may also include depositing an electrically conductive coating upon the electrical circuit and over the potting material. The method may further include connecting the electrically conductive coating to the ground of the electrical circuit.

A device may include an electrical circuit having a ground. The device may also include a potting material deposited upon the electrical circuit. The potting material may define a path to the ground of the electrical circuit. The device may further include an electrically conductive coating deposited upon the electrical circuit and over the potting material. The electrically conductive coating may be connected to the ground of the electrical circuit.

A method for shielding and potting an electrical circuit may include depositing a potting material upon an electrical circuit. The method may include providing a path to a ground of the electrical circuit. The method may also include depositing a first electrically conductive coating upon the electrical circuit and over the potting material. The method may also include connecting the first electrically conductive coating to a ground of the electrical circuit. The method may further include depositing a second electrically conductive coating upon the electrical circuit.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Referring generally to FIGS. 1 through 10, a shielded circuit assembly 100 includes an electrical circuit (e.g., electric circuit assembly 102) shielded with an electrically conductive coating 104 deposited over a potting material 112. In embodiments, the electric circuit assembly 102 may include a Printed Circuit Board (PCB)/Printed Wiring Board (PWB) (e.g., a Printed Circuit Assembly (PCA)/Printed Circuit Board Assembly (PCBA) having surface mounted electronic components connected by conductive pathways/traces 106), a single or an array processed microelectronic assembly (e.g., a semiconductor package fabricated in bulk as part of an array), a Molded Array Processing (MAP) microelectronic package, such as a micro Ball Grid Array (BGA) or a Quad Flat Nolead (QFN), a ceramic Integrated Circuit (IC) package, a lead frame IC carrier, a flexible circuit, or another type of electrical circuit. In some instances, utilizing an electrically conductive coating 104 may reduce the overall size of a fabricated assembly.

In embodiments, the electrically conductive coating 104 may be connected to a ground of the electric circuit assembly 102 utilizing a connecting material 110, as illustrated in FIGS. 1 through 9, and 17 through 21. The connecting material 110 may include any material suitable for electrically connecting the electrically conductive coating 104 to the ground of the electric circuit assembly 102, such as a ball of solder, a bead of solder, a conductive adhesive (e.g., a silver filled conductive epoxy), stud bumps, or the like. In some embodiments, the electric circuit assembly 102 may be heated to activate the connecting material 110. Alternatively, the electrically conductive coating 104 may be deposited directly onto the ground. For example, as illustrated in FIGS. 10 through 16, the electrically conductive coating 104 may directly contact a ground plane 108 of the electric circuit assembly 102. Alternatively, as illustrated in FIGS. 22 through 28, the electrically conductive coating 104 may directly contact a conductive substrate of the electric circuit assembly 102, such as when the electric circuit assembly 102 is implemented as a semiconductor package with a metal substrate.

The potting material 112 is positioned on the electric circuit assembly 102 between portions of the electric circuit and the electrically conductive coating 104 for isolating various exposed parts of the electric circuit assembly 102 (e.g., surface mounted electronic components). In embodiments, the potting material 112 may include epoxy, polyimide, polyurethane, silicone, ceramic composite, hot melt adhesive, or the like. In some embodiments, the potting material 112 may be applied utilizing a technique where liquid material is poured onto the electric circuit assembly 102 and allowed to self-level before it solidifies. This technique may sometimes be referred to as "dam and fill." For example, a tixotropic one component epoxy may be dispensed by a computer controlled robot to form a dam around the periphery of the electric circuit assembly 102. Then, a self leveling microelectronic potting compound may be dispensed by a computer controlled robot to fill the space formed by the dam. In other embodiments, a mold may be placed over the electric circuit assembly 102, and the potting material 112 may be injected into the mold to form a desired shape. In embodiments, a mold may be utilized with a semiconductor grade epoxy molding compound in conjunction with a mold press to transfer mold the potting material 112 onto the electric circuit assembly 102.

A path 114 is provided to a ground of the electric circuit assembly 102 (e.g., ground plane 108 and/or a conductive substrate of the electric circuit assembly 102). The path 114 is provided for connecting the electrically conductive coating 104 to the ground. For instance, in implementations where the potting material 112 is applied over the top of the connecting material 110, the path 114 may be formed through and/or around the potting material 112 to expose the connecting material 110. In implementations where the electrically conductive coating is applied directly to the ground of the electric circuit assembly 102, the path 114 may be formed through and/or around the potting material 112 to expose a ground plane and/or a conductive substrate of the electric circuit assembly 102.

In some embodiments, the path 114 may be machined/milled in the potting material 112, as illustrated in FIGS. 1 through 13, and 17 through 25. For example, channels forming path 114 may be cut in the potting material 112 to the depth of the connecting material 110, traces 106, and/or the conductive substrate. In embodiments, a channel may be cut utilizing a laser cutting tool, a laser ablation tool, a diamond impregnated abrasive cutting tool, or the like. Alternatively, the path 114 may include holes drilled into the potting material 112 to reach the connecting material 110/traces 106/conductive substrate. Additionally, the path may be etched into the potting material 112 (e.g., utilizing reactive ion etching, masked chemical etching, masked plasma etching, and the like). Further, an abrasive water jet may be utilized to form the path 114 in the potting material 112. In still further embodiments, the path 114 may be formed in the potting material 112 when the potting material is deposited upon the electric circuit assembly 102, such as by forming the potting material 114 in a mold including a definition for the path 114, as illustrated in FIGS. 14 through 16, and 26 through 28.

In an implementation when the potting material 112 is utilized to encapsulate the electric circuit assembly 102, the path 114 may be cut to expose the perimeter and/or internal traces of the electrical circuit. Alternatively, a mold may be utilized to keep the external perimeter of the electric circuit assembly 102 clear, and the potting material 112 may be machined away to expose internal traces of the electrical circuit. Further, a mold may be utilized to keep the external perimeter of the electric circuit assembly 102 clear, while nearly contacting internal traces and/or connecting material. Moreover, a mold may be utilized to keep all EMI shielding conductive traces clear.

In some instances, the electrically conductive coating 104 may be applied over a potting compound applied across all of the exposed ground traces and/or electronic components of an electric circuit assembly 102 to isolate the electric circuit assembly 102 from outside interference. In other instances, the coating may be applied over only a particular portion/localized area of the electric circuit assembly 102, such as applied over a potting compound applied across one or more electronic components and/or traces localized to one specific region of the electric circuit assembly 102.

The electrically conductive coating 104 may include a coating of conductive metal material, an organic material, a ceramic material, an organometallic complex, or the like. In embodiments, the electrically conductive coating 104 may include a nano silver filled organic paint such as a low temperature sintering nano particle silver, gold, copper, nickel, indium tin oxide, or the like. It should be noted that when utilized with a semiconductor package, an electrically conductive coating 104 may be selected to withstand the dicing and/or cutting necessary to separate a fabricated chip from a wafer. In an implementation where the electrically conductive coating 104 includes a coating of conductive metal material, the material may be sputtered, Chemical Vapor Deposited (CVD), plated, or the like. In some embodiments, the electrically conductive coating 104 may include a binder, and may be painted, jetted, sprayed, dipped, augered, pin transferred, and/or screened upon the electric circuit assembly 102 and over the potting material 112. In embodiments, the electrically conductive coating 104 may be deposited upon the electric circuit assembly 102 and over the potting material 112 via vapor deposition. For example, the electrically conductive coating 104 may include aluminum deposited in a vapor phase. Further, the electrically conductive coating 104 may be over molded onto the potting material 112, such as potting a silver filled epoxy material, firing a conductive ceramic material, or the like.

The electrically conductive coating 104 is electrically connected to a ground of the electric circuit assembly 102. In embodiments, the electrically conductive coating 104 may be connected to a ground plane 108 of the electric circuit assembly 102 and/or to a connecting material 110, such as when the electric circuit assembly 102 is implemented as a PCBA, as illustrated in FIGS. 1 through 16. Additionally, the electrically conductive coating 104 may be connected to a conductive substrate of the electric circuit assembly 102 and/or to a connecting material 110, such as when the electric circuit assembly 102 is implemented as a semiconductor package with a metal substrate, as illustrated in FIGS. 17 through 28. In embodiments, one electrically conductive coating may be connected to a ground of an electric circuit assembly 102 via a connection to another electrically conductive coating. For example, a second electrically conductive coating may be deposited over the electrically conductive coating 104 and may be electrically connected to the electrically conductive coating 104, which itself is electrically connected to a ground of the electric circuit assembly 102. Thus, the electrically conductive coating 104 (and possibly one or more other electrically conductive coatings) may provide Electromagnetic Interference (EMI) shielding for one or more electronic components of the electric circuit assembly 102.

A second electrically conductive coating may be deposited upon the electric circuit assembly 102 (e.g., over the top of the electrically conductive coating 104 or separated from the electrically conductive coating 104 by some distance). One coating may be applied over one localized area/region (or some portion thereof) of another coating. For instance, the second electrically conductive coating may be deposited over at least a portion of the electrically conductive coating 104. Further, a second potting material may be interposed between the electrically conductive coating 104 (or some portion thereof) and the second electrically conductive coating. The second electrically conductive coating may be connected to the electrically conductive coating 104, a ground plane, and/or a conductive substrate of the electric circuit assembly 102. Alternatively, a potting compound and the electrically conductive coating 104 may be applied to one localized area of the electric circuit assembly 102, and a potting compound and the second electrically conductive coating may be applied to another localized area of the electric circuit assembly 102. These two localized areas may be separated from one another by some distance across the electric circuit assembly 102. It should be noted that various different coatings may be utilized for different areas of an electric circuit assembly. Additionally, one or more coatings may be applied to one side of an electric circuit assembly, and one or more other coatings may be applied to another side of the electric circuit assembly.

It should be noted that while accompanying figures show the electrically conductive coating 104 contacting an interior portion of the electric circuit assembly 102, such a configuration is provided by way of example and is not meant to limit the scope of the disclosure. Thus, it will be appreciated that in other embodiments, the electrically conductive coating 104 may not contact a connecting ground plane 108/conductive substrate on an interior portion of the electric circuit assembly 102. For example, the electrically conductive coating may contact the metal substrate of a semiconductor package only at its periphery.

In some embodiments, a second/top potting layer may be applied over some or all of the electrically conductive coating 104 to form a shielded circuit assembly. This may be useful to shield the electrically conductive coating 104 from mechanical and/or environmental forces. In an implementation, the top potting layer may be utilized with an electric circuit assembly 102 included in a high shock or vibration environment, or the like.

Figure 1:
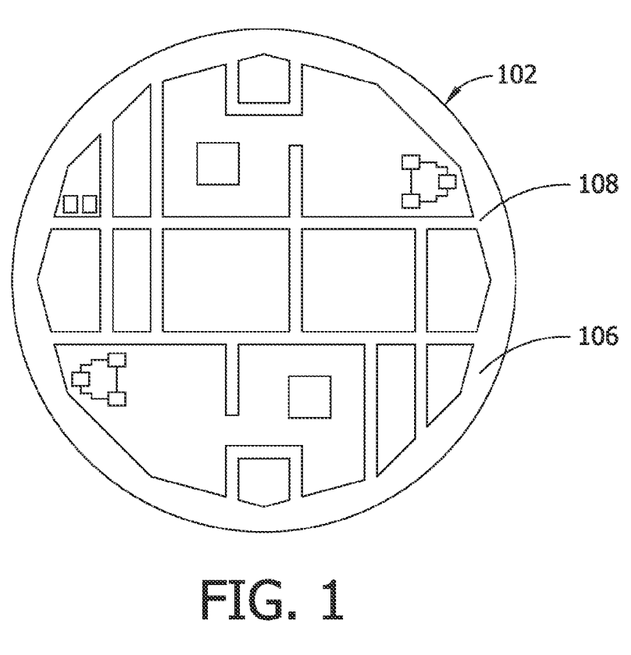
FIG. 1 is a top plan view illustrating an electric circuit assembly including a printed wiring board having surface mounted electronic components.
Figure 2:
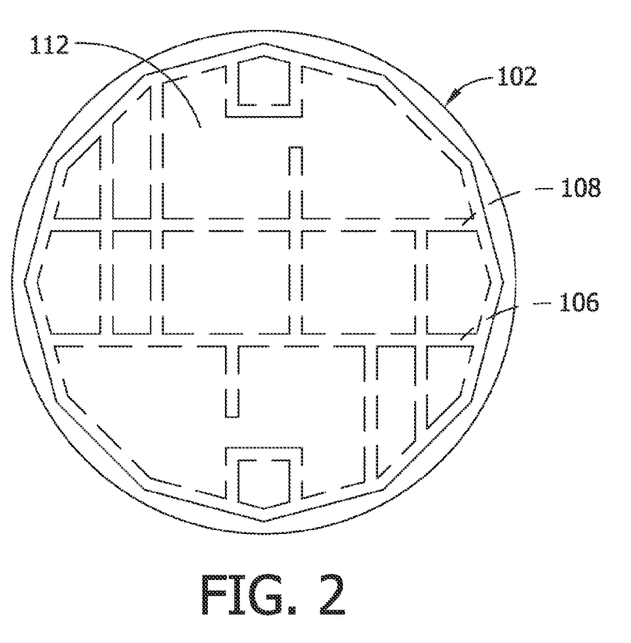
FIG. 2 is a top plan view illustrating the electric circuit assembly shown in FIG. 1, where a potting material has been deposited upon the electric circuit assembly.
Figure 3:
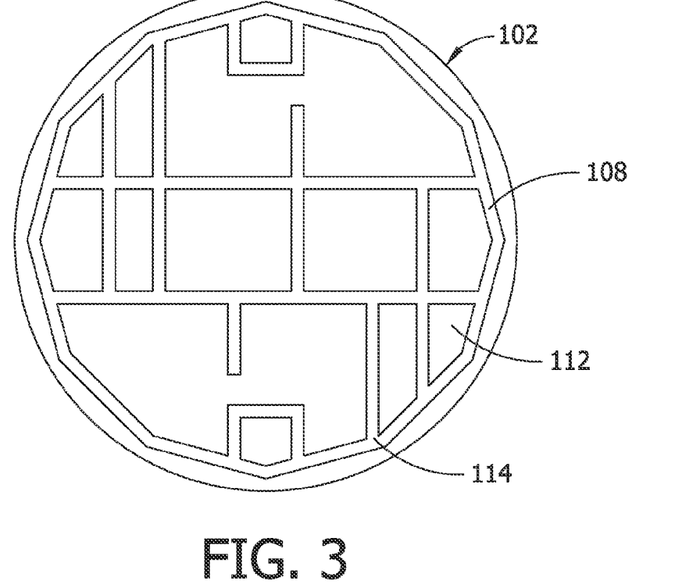
FIG. 3 is a top plan view illustrating the electric circuit assembly shown in FIG. 2, where a conductive path has been provided to the electric circuit.
Figure 4:
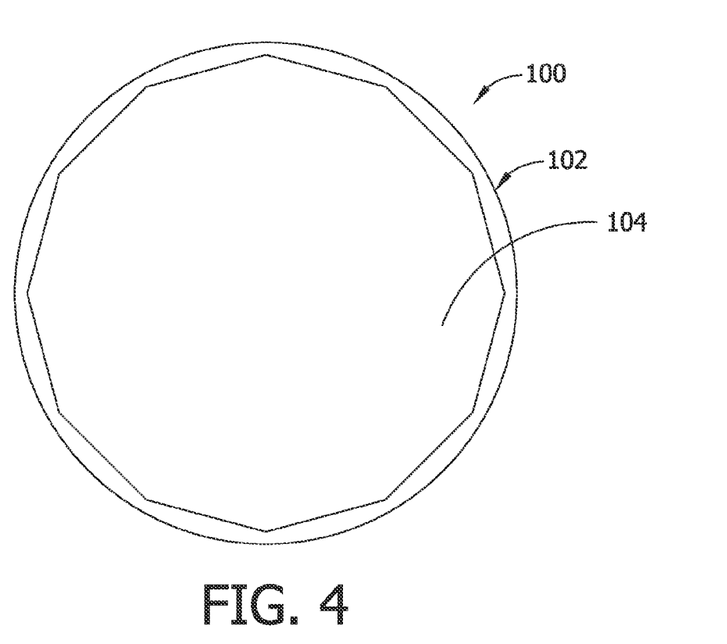
FIG. 4 is a top plan view illustrating the electric circuit assembly shown in FIG. 3, where an electrically conductive coating has been deposited upon the electric circuit assembly and over the potting material to form a shielded circuit assembly.
Figure 5:
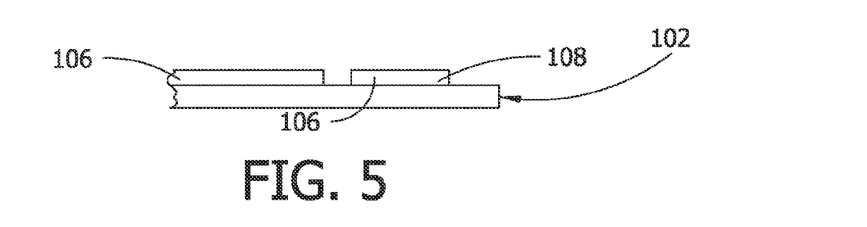
FIG. 5 is a partial cross-sectional side elevation view illustrating the electric circuit assembly shown in FIG. 1.
Figure 6:
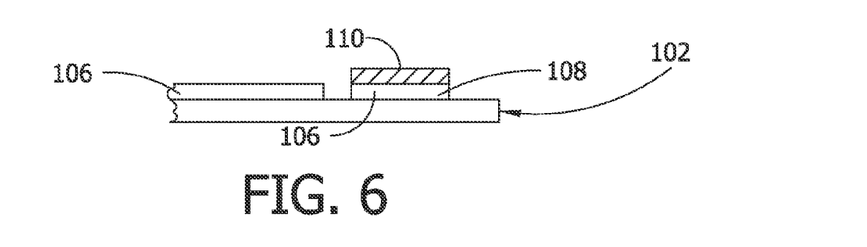
FIG. 6 is a partial cross-sectional side elevation view illustrating the electric circuit assembly shown in FIG. 5, where a conductive connecting material has been applied upon a ground of the electric circuit assembly.
Figure 7:
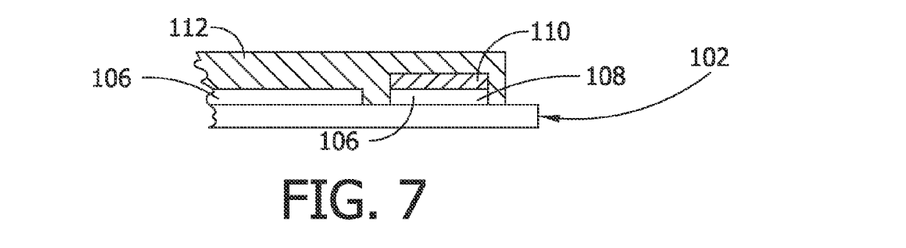
FIG. 7 is a partial cross-sectional side elevation view illustrating the electric circuit assembly shown in FIG. 6, where a potting material has been deposited upon the electric circuit assembly.
Figure 8:
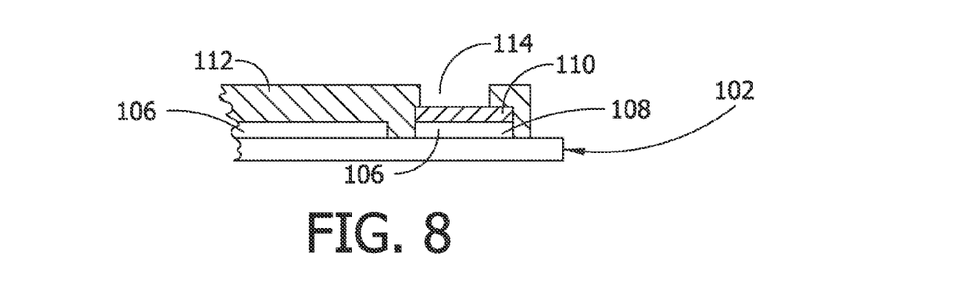
FIG. 8 is a partial cross-sectional side elevation view illustrating the electric circuit assembly shown in FIG. 7, where a conductive path has been provided to the conductive connecting material.
Figure 9:
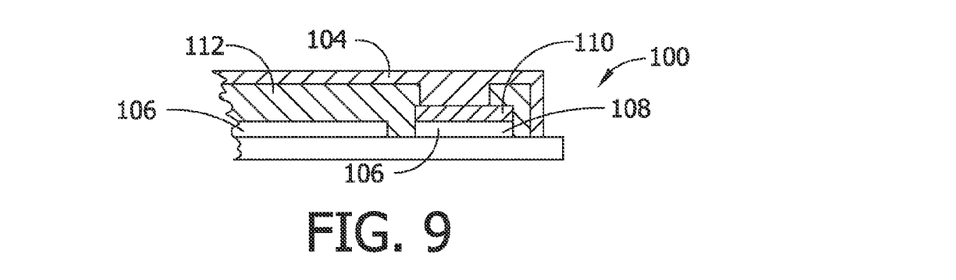
FIG. 9 is a partial cross-sectional side elevation view illustrating the electric circuit assembly shown in FIG. 8, where an electrically conductive coating has been deposited upon the electric circuit assembly and over the potting material to form a shielded circuit assembly.
Figure 10:
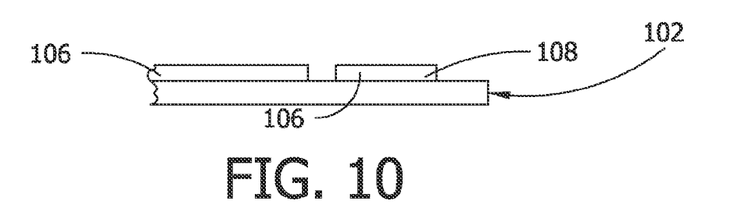
FIG. 10 is a partial cross-sectional side elevation view illustrating an electric circuit assembly including a printed wiring board having surface mounted electronic components.
Figure 11:
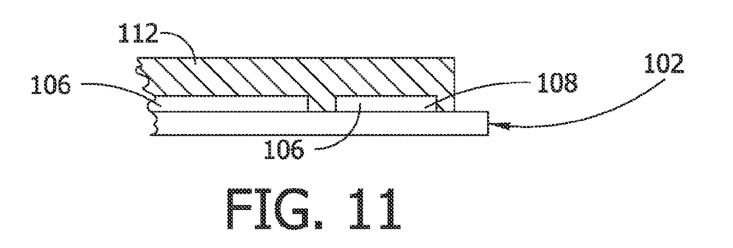
FIG. 11 is a partial cross-sectional side elevation view illustrating the electric circuit assembly shown in FIG. 10, where a potting material has been deposited upon the electric circuit assembly.
Figure 12:
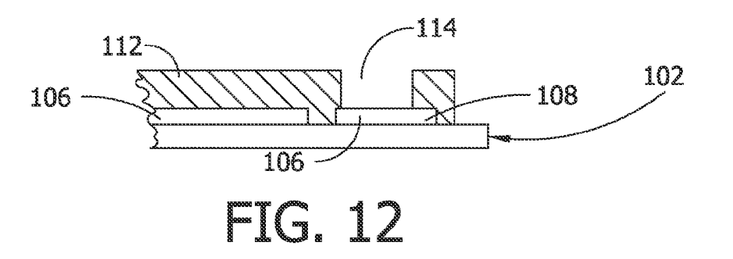
FIG. 12 is a partial cross-sectional side elevation view illustrating the electric circuit assembly shown in FIG. 11, where a conductive path has been provided to a ground of the electric circuit assembly.
Figure 13:
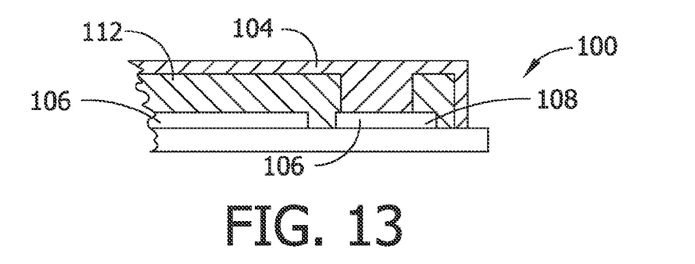
FIG. 13 is a partial cross-sectional side elevation view illustrating the electric circuit assembly shown in FIG. 12, where an electrically conductive coating has been deposited upon the electric circuit assembly and over the potting material to form a shielded circuit assembly.
Figure 14:
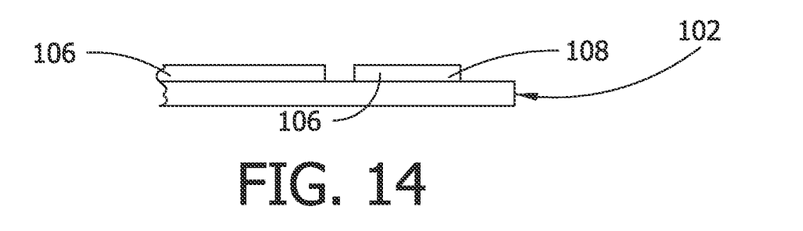
FIG. 14 is a partial cross-sectional side elevation view illustrating an electric circuit assembly including a printed wiring board having surface mounted electronic components connected by traces.
Figure 15:
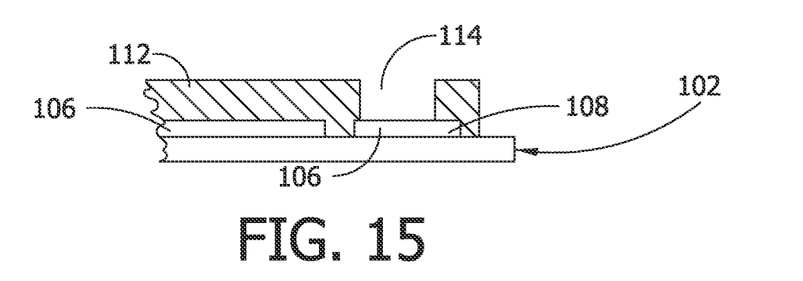
FIG. 15 is a partial cross-sectional side elevation view illustrating the electric circuit assembly shown in FIG. 14, where a potting material has been deposited upon the electric circuit assembly such that a path has been provided to a ground of the electric circuit assembly.
Figure 16:
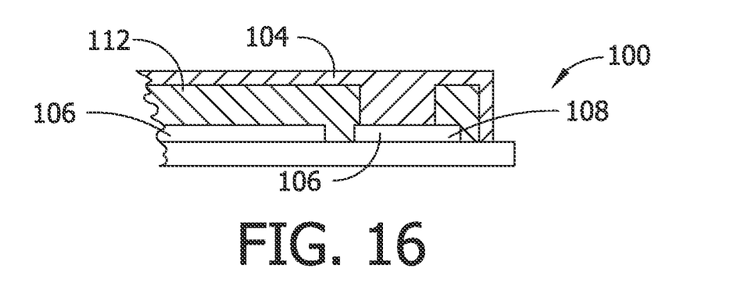
FIG. 16 is a partial cross-sectional side elevation view illustrating the electric circuit assembly shown in FIG. 15, where an electrically conductive coating has been deposited upon the electric circuit assembly and over the potting material to form a shielded circuit assembly.
Figure 17:
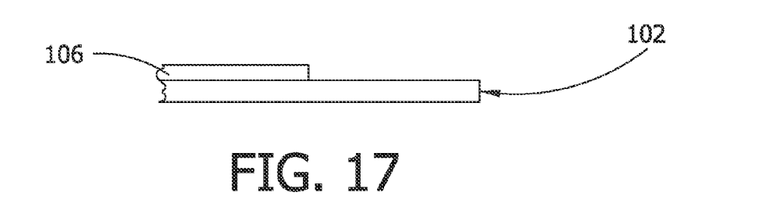
FIG. 17 is a partial cross-sectional side elevation view illustrating an electric circuit assembly including a semiconductor package.
Figure 18:
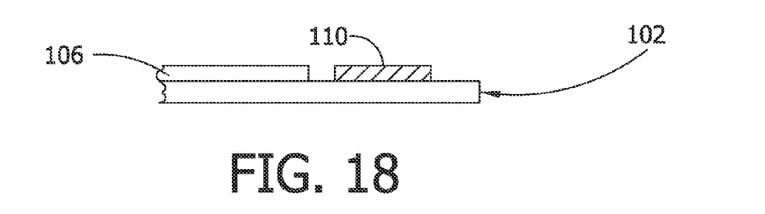
FIG. 18 is a partial cross-sectional side elevation view illustrating the electric circuit assembly shown in FIG. 17, where a conductive connecting material has been applied upon a conductive substrate of the electric circuit assembly.
Figure 19:
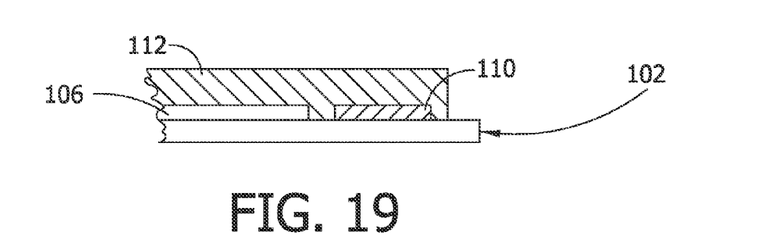
FIG. 19 is a partial cross-sectional side elevation view illustrating the electric circuit assembly shown in FIG. 18, where a potting material has been deposited upon the electric circuit assembly.
Figure 20:
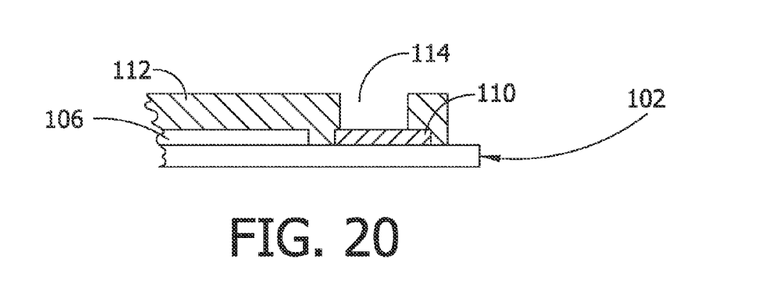
FIG. 20 is a partial cross-sectional side elevation view illustrating the electric circuit assembly shown in FIG. 19, where a conductive path has been provided to the conductive connecting material.
Figure 21:
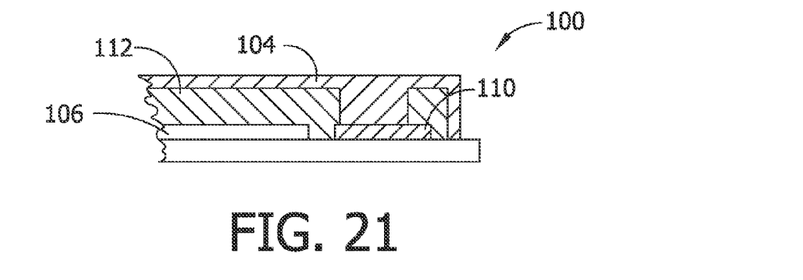
FIG. 21 is a partial cross-sectional side elevation view illustrating the electric circuit assembly shown in FIG. 20, where an electrically conductive coating has been deposited upon the electric circuit assembly and over the potting material to form a shielded circuit assembly.
Figure 22:
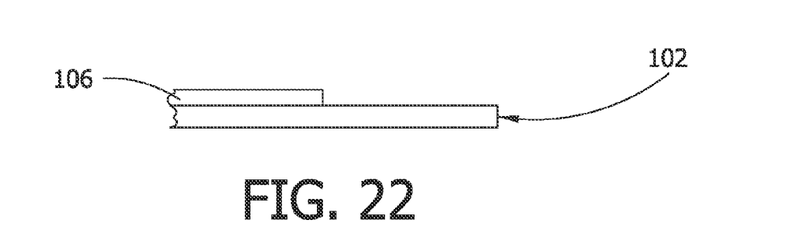
FIG. 22 is a partial cross-sectional side elevation view illustrating an electric circuit assembly including a semiconductor package.
Figure 23:
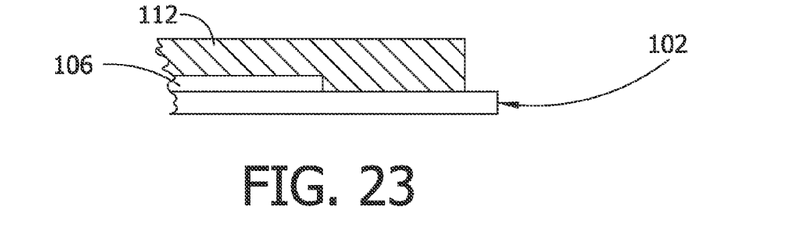
FIG. 23 is a partial cross-sectional side elevation view illustrating the electric circuit assembly shown in FIG. 22, where a potting material has been deposited upon the electric circuit assembly.
Figure 24:
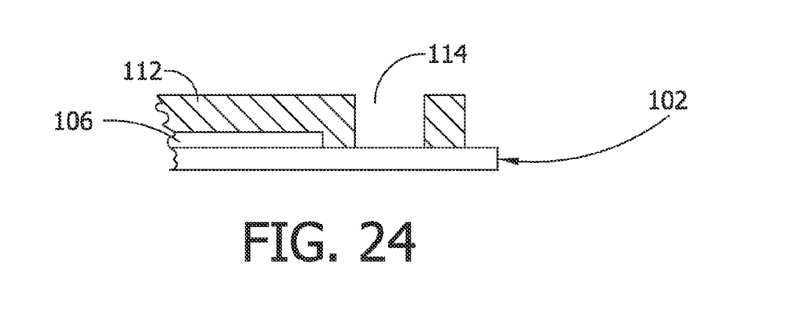
FIG. 24 is a partial cross-sectional side elevation view illustrating the electric circuit assembly shown in FIG. 23, where a conductive path has been provided to a conductive substrate of the electric circuit assembly.
Figure 25:
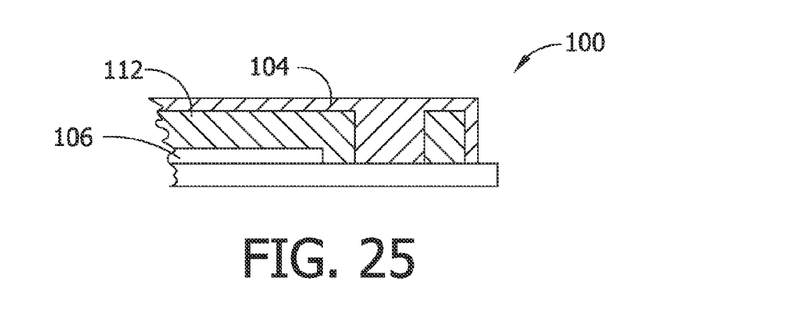
FIG. 25 is a partial cross-sectional side elevation view illustrating the electric circuit assembly shown in FIG. 24, where an electrically conductive coating has been deposited upon the electric circuit assembly and over the potting material to form a shielded circuit assembly.
Figure 26:
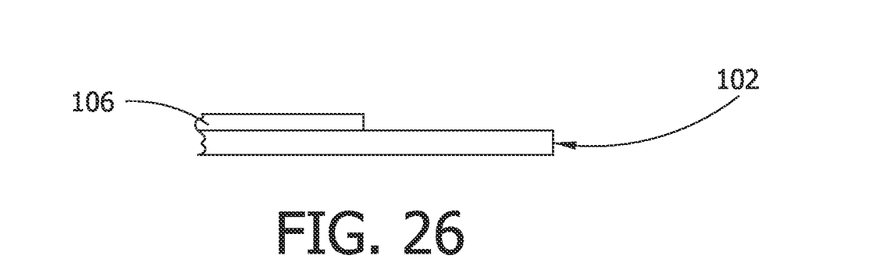
FIG. 26 is a partial cross-sectional side elevation view illustrating an electric circuit assembly including a semiconductor package.
Figure 27:
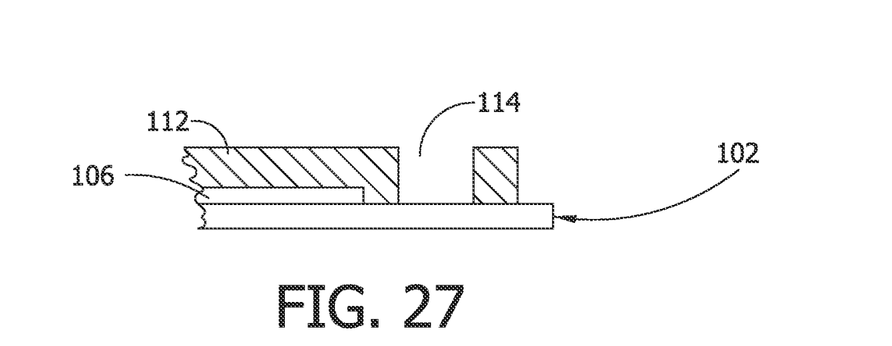
FIG. 27 is a partial cross-sectional side elevation view illustrating the electric circuit assembly shown in FIG. 26, where a potting material has been deposited upon the electric circuit assembly such that a path has been provided to a conductive substrate of the electric circuit assembly.
Figure 28:
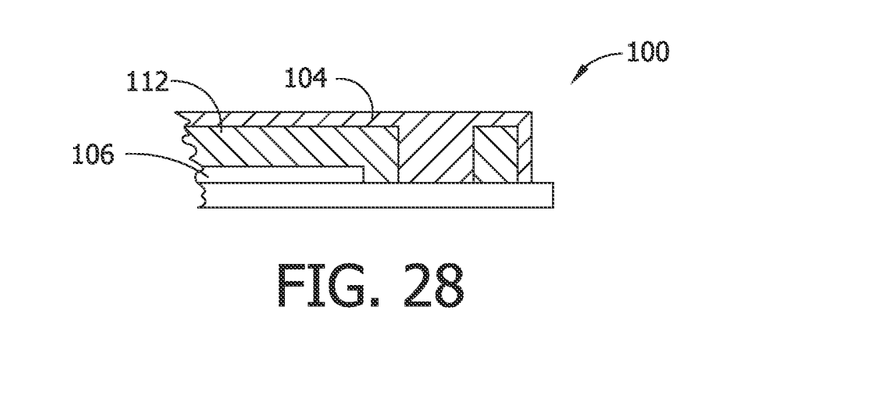
FIG. 28 is a partial cross-sectional side elevation view illustrating the electric circuit assembly shown in FIG. 27, where an electrically conductive coating has been deposited upon the electric circuit assembly and over the potting material to form a shielded circuit assembly.
Figure 29:
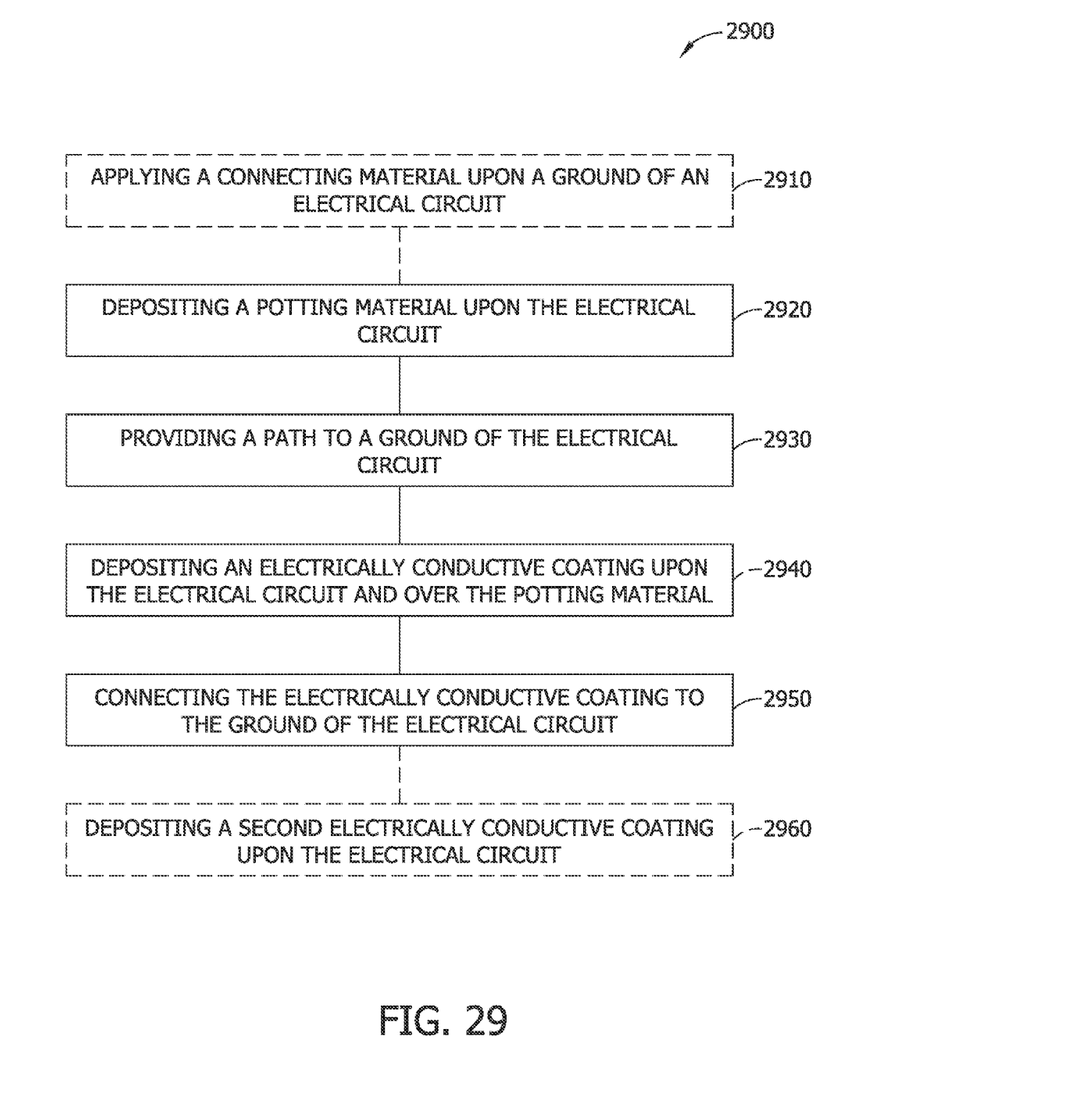
FIG. 29 is a flow diagram illustrating a method for shielding an electrical circuit.

A method 2900 for shielding and potting an electrical circuit may include applying a connecting material upon a ground of the electrical circuit, 2910 (e.g., utilizing a ball of solder, a bead of solder, a conductive adhesive, and/or stud bumps applied to a ground plane and/or a conductive substrate as previously described).

The method includes depositing a potting material upon an electric circuit assembly, 2920 (e.g., utilizing epoxy, polyimide, polyurethane, silicone, ceramic composite, and/or hot melt adhesive applied utilizing a dam and fill technique and/or an injection molding technique as previously described).

Next, the method includes providing a path to a ground of the electric circuit assembly, 2930 (e.g., utilizing machining, milling, laser, drilling, reactive ion etching, and/or chemical etching to provide a path to a ground plane and/or a connecting material as previously described).

Then, the method includes depositing an electrically conductive coating upon the electric circuit assembly and over the potting material, 2940 (e.g., utilizing a metal material, an organic material, a ceramic material, and/or an organometallic complex that may be painted, jetted, sprayed, dipped, augered, pin transferred, screened and/or deposited via vapor deposition upon an electric circuit assembly and over the potting material as previously described).

Next, the method includes connecting the electrically conductive coating to a ground of the electric circuit assembly, 2950 (e.g., utilizing the conductive path to connect the electrically conductive coating to a ground of the electric circuit assembly, the connecting material, and/or another electrically conductive coating as previously described).

In some instances, a second electrically conductive coating may be deposited upon the electric circuit assembly, 2960 (e.g., deposited over the top of the first electrically conductive coating (or some portion thereof), separated from the first electrically conductive coating by some distance, and/or applied to another side of the electric circuit assembly as previously described).

In the present disclosure, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A device, comprising:
   an electrical circuit having a ground plane, the ground plane located on an upper surface of the electrical circuit;
   a potting material deposited upon the electrical circuit, the potting material defining a path to the ground plane of the electrical circuit; and
   a first electrically conductive coating deposited upon the electrical circuit and over the potting material, the first electrically conductive coating connected to the ground plane of the electrical circuit; and
   a second electrically conductive coating deposited in a distinct layer upon a portion of the first electrically conductive coating and electrically connected to the first electrically conductive coating.

2. The device of claim 1, wherein the electrical circuit includes at least one of a printed circuit board, a printed wiring board, a microelectronic assembly, a semiconductor package, a molded array processing microelectronic package, a ceramic integrated circuit package, a lead frame integrated circuit carrier, or a flexible circuit.

3. The device of claim 1, wherein the first electrically conductive coating and the second electrically conductive coating include at least one of a metal material, an organic material, a ceramic material, or an organometallic complex.

4. The device of claim 1, wherein the first electrically conductive coating and the second electrically conductive coating are at least one of sputtered, chemical vapor deposited, plated, painted, jetted, sprayed, dipped, augered, pin transferred, screened, or over molded.

5. The device of claim 1, wherein the potting material includes at least one of epoxy, polyimide, polyurethane, silicone, ceramic composite, or hot melt adhesive.

6. The device of claim 1, further comprising:
   a connecting material applied upon a ground of the electrical circuit.

7. The device of claim 1, wherein the second electrically conductive coating is separated from the first electrically conductive coating by a distance.

8. The device of claim 7, further comprising:
   a second potting material deposited between the first electrically conductive coating and the second electrically conductive coating.

* * * * *